(12) United States Patent
Wu et al.

(10) Patent No.: US 11,475,805 B2
(45) Date of Patent: Oct. 18, 2022

(54) SWITCHABLE DISPLAYS WITH MOVABLE PIXEL UNITS

(71) Applicant: Hewlett-Packard Development Company, L.P., Spring, TX (US)

(72) Inventors: Kuan-Ting Wu, Taipei (TW); Chi Hao Chang, Taipei (TW); Xuan Shi, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/042,383

(22) PCT Filed: Sep. 27, 2018

(86) PCT No.: PCT/US2018/053133
§ 371 (c)(1),
(2) Date: Sep. 28, 2020

(87) PCT Pub. No.: WO2020/068085
PCT Pub. Date: Apr. 2, 2020

(65) Prior Publication Data
US 2021/0217331 A1    Jul. 15, 2021

(51) Int. Cl.
*G09F 9/37*    (2006.01)
*B81B 5/00*    (2006.01)
*G02B 26/08*    (2006.01)

(52) U.S. Cl.
CPC .................. *G09F 9/37* (2013.01); *B81B 5/00* (2013.01); *G02B 26/0833* (2013.01); *B81B 2201/04* (2013.01); *B81B 2203/051* (2013.01); *B81B 2203/056* (2013.01)

(58) Field of Classification Search
None
See application file for complete search history.

(56) References Cited

U.S. PATENT DOCUMENTS

| 7,978,407 B1 * | 7/2011 | Connor ........... G02B 30/27 348/54 |
| 9,898,076 B1 | 2/2018 | Shah |
| 10,317,731 B2 * | 6/2019 | Sakaigawa ........ G02F 1/133615 |
| 2001/0053016 A1 * | 12/2001 | Nelson ............ G02B 26/0841 359/290 |

(Continued)

FOREIGN PATENT DOCUMENTS

RU    2473935 C1    1/2013

OTHER PUBLICATIONS

Julien Happich, "Hybrid Display Combines Transmissive, Reflective Technologies", Smart2.0, Jun. 22, 2016, 2 pgs.

(Continued)

*Primary Examiner* — Patrick N Edouard
*Assistant Examiner* — Peijie Shen
(74) *Attorney, Agent, or Firm* — Austin Rapp

(57) ABSTRACT

In an example, a switchable display may include a movable pixel unit having a rotatable motive element. The movable pixel unit may further include a first display unit having a first display characteristic and disposed on a first side of the rotatable motive element. The movable pixel unit may further include a second display unit having a second display characteristic and disposed on a second side of the rotatable motive unit, different from the first side.

13 Claims, 3 Drawing Sheets

(56) References Cited

U.S. PATENT DOCUMENTS

| | | | |
|---|---|---|---|
| 2003/0123126 A1* | 7/2003 | Meyer | G02B 26/0841 |
| | | | 359/290 |
| 2004/0125430 A1 | 7/2004 | Kasajima et al. | |
| 2004/0240777 A1 | 12/2004 | Woodgate et al. | |
| 2008/0212034 A1* | 9/2008 | Aksyuk | G02B 27/48 |
| | | | 353/20 |
| 2013/0088856 A1 | 4/2013 | Kim et al. | |
| 2013/0127880 A1 | 5/2013 | Sasagawa | |
| 2013/0187962 A1 | 7/2013 | Vieri et al. | |
| 2017/0180687 A1* | 6/2017 | Wang | G02B 26/0833 |
| 2017/0285403 A1 | 10/2017 | Dao et al. | |
| 2019/0204581 A1* | 7/2019 | He | G02B 26/001 |
| 2020/0020270 A1* | 1/2020 | Im | G02B 5/3025 |
| 2021/0168349 A1* | 6/2021 | Wu | G09G 3/20 |
| 2021/0217331 A1* | 7/2021 | Wu | G09F 9/37 |
| 2021/0280099 A1* | 9/2021 | Wu | G09F 11/025 |

OTHER PUBLICATIONS

Priya Ganapati, "Up Close and Personal With the Pixel Qi Display", Wired, Nov. 1, 2010, 12 pgs.

* cited by examiner

SWITCHABLE DISPLAYS WITH MOVABLE PIXEL UNITS

BACKGROUND

Electronic devices such as computing devices may have or be used with a display, which may show or present content to a user of the electronic device. In some situations, such electronic devices may be integrated with the display as a single device and may include clamshell-style computing devices such as laptop or notebook computers, tablets, smartphones, all-in-one (AIO) computing devices, or other integrated electronic devices. In other situations, a display may be a standalone device, such as a computer monitor, and may be communicatively engaged with a separate computing device, e.g., through the use of a cable, to form the overall electronic device. Displays may use a variety of display technologies, e.g., liquid crystal displays, light-emitting diodes, electrophoretic displays, or other display technologies.

DETAILED DESCRIPTION

Figure 1:
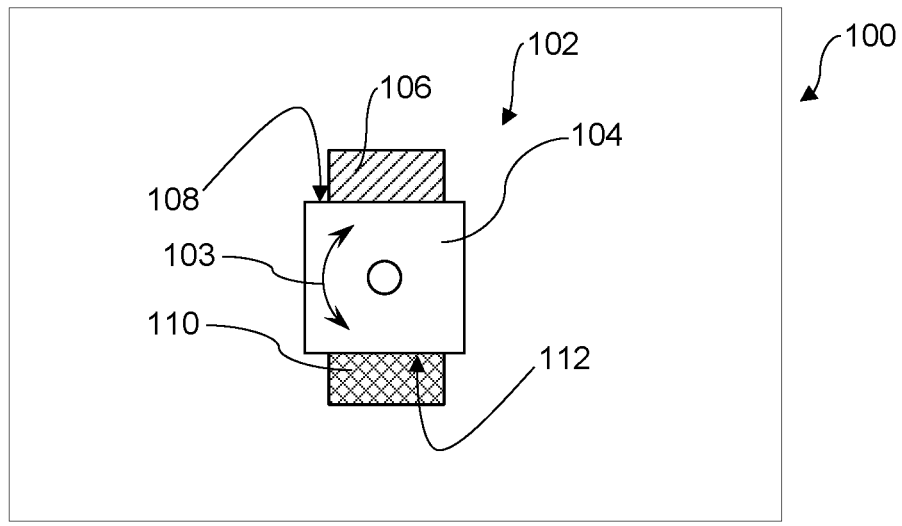
FIG. 1 is a schematic view of an example switchable display having movable pixel units.

Electronic devices such as computing devices may have or be used with a display, which may show or present content to a user of the electronic device. In some situations, such electronic devices may be integrated with the display as a single device and may include clamshell-style computing devices such as laptop or notebook computers, tablets, smartphones, all-in-one (AIO) computing devices, or other types of integrated computing devices. In other situations, a display may be a standalone device, such as a computer monitor, and may be communicatively engaged with a separate computing device, e.g., through the use of a cable, wireless communication, etc., to form the overall electronic device.

Displays may use a variety of display technologies, e.g., liquid crystal displays (LCD's), light-emitting diodes (LED's), organic LED (OLED), electrophoretic displays, or other display technologies. Some types of display technologies may require or consume more power than other types. Additionally, some types of display technologies may be emissive or backlit, i.e., they emit their own light from the display in order to present an image or content. Other display technologies may be reflective, i.e., they reflect environmental or ambient light in order to present content on the display. Other display technologies may include transflective display technologies. Such technologies have the capabilities to both reflect environmental light, as well as emit a backlight in order to present an image or content.

Since reflective display technologies do not emit light, they tend to use or consume less power than, for example, emissive display technologies. Further, if there is an abundance of ambient or environmental light available, an emissive display may appear to be washed out, faded, or dim if the backlight is not as strong or bright as the ambient light, whereas a reflective display may maintain a bright enough image to still be seen by a user since it is making use of the ambient light to display the content. However, reflective displays may have a relatively low refresh rate compared to emissive display technologies like LED or backlit LCD displays. Thus, content that changes rapidly, e.g., video, fast-changing menus or graphical user interfaces (GUI's), etc., may not be presented very favorably on reflective displays, and may result in an image shadow or ghost remaining for a time on the display after the display is refreshed to change to a different image or content.

Therefore, it may be desirable for an electronic device to be able to change the display technology of a display, depending on the type of content being presented or viewed. For example, if a user is using an electronic device to view a movie or video, play a video game, or interact with a series of fast-changing menus, etc., it may be advantageous for the display of the electronic device to utilize an emissive display technology such as LED, OLED, backlit LCD, or another technology having a backlight and a relatively high refresh rate. In other situations, if a user is using the electronic device outdoors in the sun, or in another brightly-lit area, and/or if the user is viewing content that is relatively steady-state such as reading text or an e-book, viewing a still image, or another type of content that does not need a high refresh rate, it may be desirable for the electronic device to make use of a reflective display technology to take advantage of its high contrast ratio and low power consumption. Further, it may also be desirable to utilize a reflective display technology if the electronic device is running low on battery power or is in a low-power mode to minimize the power consumption of the display.

Implementations of the present disclosure provide a switchable display that may enable an electronic device to utilize either an emissive display technology or a reflective display technology on the same display, depending on the type of content being viewed, environment that the device is in, or other considerations. Example switchable displays described herein may have movable pixel units that may be able to switch, on a pixel-by-pixel basis, the type of display technology being utilized by the switchable display.

Referring now to FIG. 1, a schematic view of an example switchable display 100 is illustrated. Example switchable display may be or be a part or portion of a display being used in conjunction with, either integrally or separably, an electronic device. Example switchable display 100 may include a movable pixel unit 102 having a rotatable motive element 104. The movable pixel unit 102 may further include a first display unit 106 having a first display characteristic and disposed on a first side 108 of the rotatable motive element 104. The movable pixel unit 102 may further include a second display unit 110 having a second display characteristic and disposed on a second side 112 of the rotatable motive unit 104, different from the first side 108.

The movable pixel unit 102 may correspond to a single pixel of a display. Thus, each of the first and second display units 106 and 110 may be able to output one pixel worth of visual content to be presented on the display. In other words, each of the first and second display units 106 and 110 may be a single pixel in an overall visual content output by a display. Additionally, in some implementations, each of the first and second display units 106 and 110 may have sub-pixels, with each sub-pixel representing or providing, for example, a different color. In other words, each of the first and second display units 106 and 110 may represent a single pixel, yet each may further be subdivided into multiple sub-pixels. Further, the position of the movable pixel unit 102 determines which of the first and second display units 106 and 110 are to present the visual content.

The position of the movable pixel unit 102 may be able to be changed by the rotatable motive element 104. The rotatable motive element 104 may be able to move the movable pixel unit 102 between a first position, wherein the first display unit 106 is facing the display, and a second position, wherein the second display unit 110 is facing the display. Additionally, the first position may correspond to a first display mode of the display, and, similarly, the second position may correspond to a second display mode of the display. In some implementations, the rotatable motive element 104 may be able to move or rotate along direction 103, about an axis orthogonal to the view plane of FIG. 1, in order to change the movable pixel unit 102 between the first position and the second position. As such, the rotatable motive element 104 may be any type of rotatable component able to support the first and second display units 106 and 110, and able to rotate between the first and second position within the space reserved for a single pixel of a display. In some implementations, the rotatable motive element 104 may be a microelectromechanical motor and/or may be a part of a microelectromechanical system (MEMS). As such, in some implementations, the rotatable motive element 104 may comprise components between 1 and 100 micrometers in size, i.e., 0.001 to 0.1 millimeters (mm).

Each of the first display unit 106 and the second display unit 110 may have a different display characteristic. As such, first display unit 106 is schematically illustrated with angled hatch lines, while second display unit 110 is illustrated with cross-hatch lines. The first display unit 106 may have a first display characteristic, which may be an emissive display characteristic. Such emissive display characteristic may refer to the first display unit 106 having the ability to emit light in order to provide a single pixel portion of a visual content for the display. As such, the first display unit 106 may include light-emitting components such as LED's, mini or micro-LED's, OLED's, or other emissive display components.

The second display unit 110 may have a second display characteristic, which may be a reflective display characteristic. Such reflective display characteristic may refer to the second display unit 110 having the ability to reflect ambient or environmental light received by the second display unit 110 in order to provide a single pixel portion of a visual content for the display. As such, the second display unit 110 may include reflective display components such as electrophoretic display components, cholesteric display components, non-backlit LCD components, electronic paper or ink (e-paper, e-ink), or other reflective display components, materials, or structures.

Figure 2A:
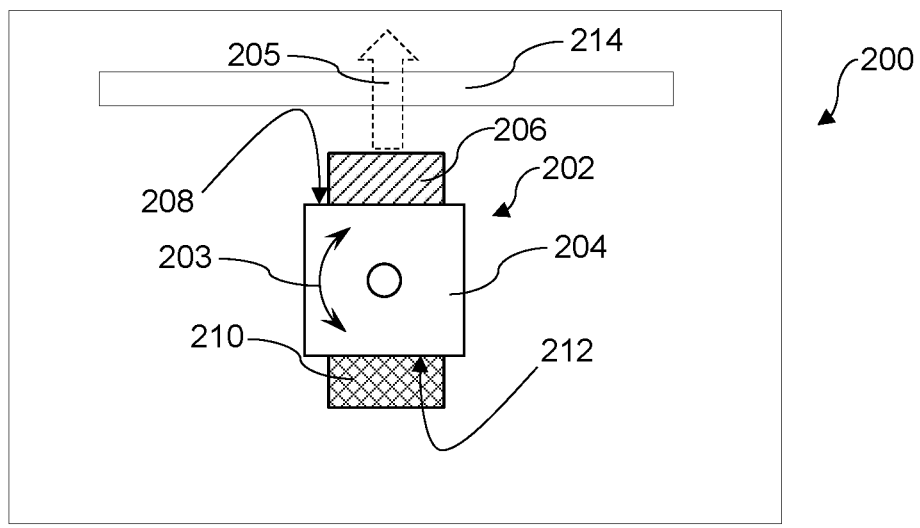
FIG. 2A is schematic view of another example switchable display having movable pixel units.

Referring now to FIG. 2A, a schematic view of another example switchable display 200 is illustrated. Example switchable display 200 may be similar to example switchable display 100, described above. Further, the similarly-named elements of example switchable display 200 may be similar in function and/or structure to the respective elements of example switchable display 100, as they are described above. The switchable display 200 may include a movable pixel unit 202 having a rotatable motive element 204, a first display unit 206, and a second display unit 210. The first display unit 206 may be disposed on a first side 208 of the rotatable motive element 204, and the second display unit 210 may be disposed on a second side 212 of the rotatable motive element 204, which may be an opposite side, e.g., diametrically opposite, from the first side 208. As such, the movable pixel unit 202 may include a box, housing, or other type of support structure on the first side 208 and the second side 212 to support and house the first display unit 206 and the second display unit 210, respectively, and any associated components or connections. The switchable display 200 may further include a display screen 214 disposed adjacent to the moveable pixel unit 202, such that the movable pixel unit 202, or each of the first and second display units 206 and 210, may present or provide a single pixel portion of a visual content, or a multiple sub-pixel portion of the visual content, through or on to the display screen 214. In some implementations, the display screen 214 may be a display screen used in conjunction with an electronic device in order to present or show visual content, e.g., images, text, videos, GUI's, etc., to a user of the electronic device. In some implementations, the display screen 214 may be a screen for a flat-panel display.

Figure 2B:
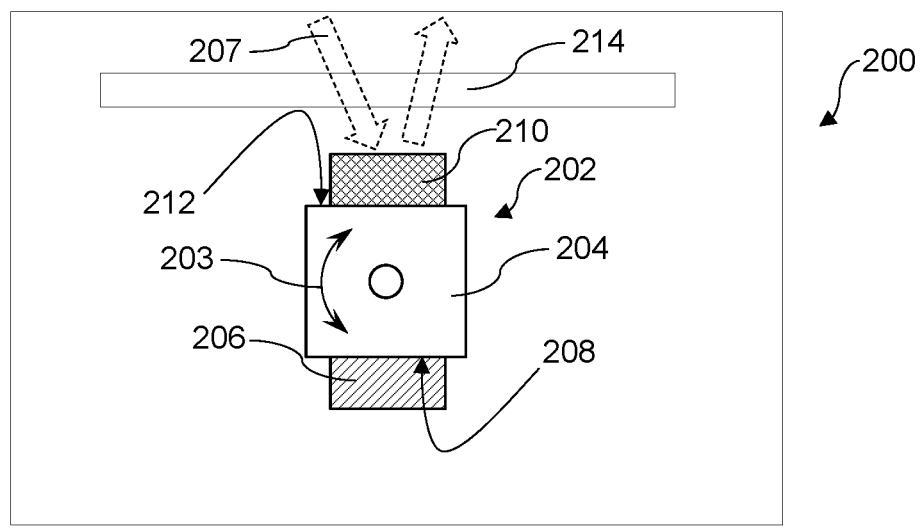
FIG. 2B is another schematic view of the example switchable display of FIG. 2A.

The movable pixel unit 202 may be movable by the rotatable motive element 204 between a first position, representing a first display mode, and a second position, representing a second display mode. The rotatable motive element 204 may rotate, e.g., along example direction 203, the movable pixel unit 202 to the first position, illustrated in FIG. 2A, to position the first display unit 206 to face the display screen 214 in the first display mode. Referring additionally to FIG. 2B, another schematic view of example switchable display 200 is illustrated wherein the movable pixel unit 202 is disposed in the second position. The rotatable motive element 204 may rotate, e.g., along example direction 203, the movable pixel unit 202 to the second position to position the second display unit 206 to face the display screen 214 in the second display mode. In some implementations, the first and second display units 206 and 210 may be substantially parallel to the display screen 214 when disposed in the first position and the second position, respectively. In this context, substantially parallel may refer to the orientation of each of the first and second display units 206 and 210 being aligned or flat enough with the display screen so as to each be able to provide a single pixel portion of a visual content to or through the display screen, when each is disposed in the respective first and second positions.

The first display unit 206 may have a first display characteristic, which may be an emissive display characteristic. As such, when the switchable display 200 is in the first display mode and the rotatable motive element 204 has transitioned the movable pixel unit 202 to the first position, the first display unit 206 is to provide a single pixel portion of a visual content to or through the display screen 214 with an emissive display technology, i.e., by emitting light from the first display unit 206 through the display screen 214, as represented by arrow 205 in order to provide visual content. As such, the first display mode may be referred to as an emissive display mode.

The second display unit 210 may have a second display characteristic, which may be a reflective display characteristic. As such, when the switchable display 200 is in the second display mode and the rotatable motive element 204 has transitioned the movable pixel unit 202 to the second position, as illustrated by FIG. 2B, the second display unit 210 is to provide a single pixel portion of a visual content to or through the display screen 214 with a reflective display technology. In other words, the second display unit 210 is to receive environmental or ambient light, or light shining towards or on to the display screen 214, through the display screen 214, and to then reflect such light from the second display unit 210 back through the display screen 214, as represented by arrows 207, in order to provide visual content. As such, the second display mode may be referred to as a reflective display mode.

Figure 3A:
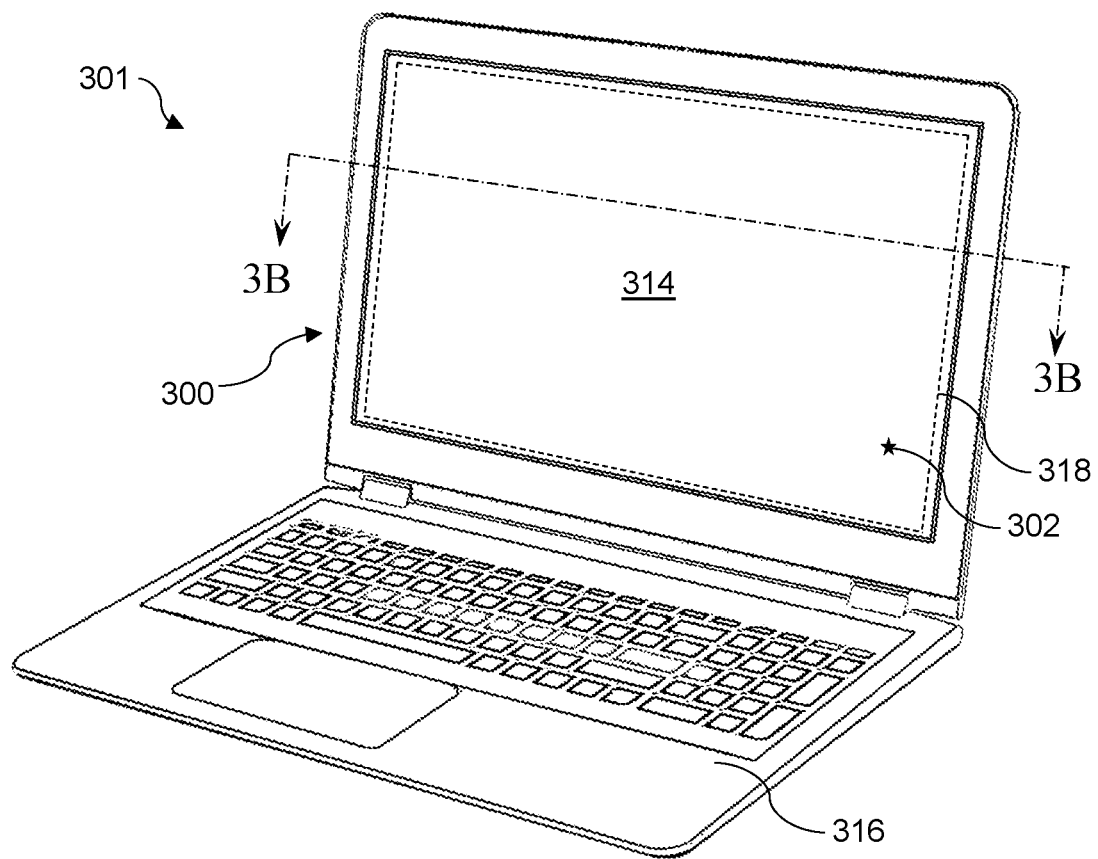
FIG. 3A is a perspective view of an example electronic device having another example switchable display.

Referring now to FIG. 3A, a perspective view of an example electronic device 301 having another example switchable display 300 is illustrated. Example switchable display 300 may be similar to other example switchable displays, described above. Further, the similarly-named elements of example switchable display 300 may be similar in function and/or structure to the respective elements of other example switchable displays, as they are described above. FIG. 3A may further include a computing device portion 316, the switchable display 300 attached to the computing device portion 316.

Electronic device 301 may be a computing device having or being communicatively connected to a display to present or show visual content to a user. In some implementations, electronic device 301 may be an integrated computing device, wherein the switchable display 300 and the computing device portion 316 are integrated into a single device such as a clamshell-style laptop or notebook computing device, in some implementations. While illustrated as a notebook or laptop computing device, it should be noted that, in other implementations, electronic device 301 may be another type of integrated electronic device, such as a tablet, smartphone, all-in-one (AIO) computing device, or another type of integrated computing device. In other implementations, the switchable display 300 may be a part of a standalone display for use with a separate computing device, e.g., a computer monitor, television panel, etc.

The computing device portion 316 may contain other components of the electronic device 301, e.g., processors, storage drives, system boards, memory, batteries, keyboards, touch pads, touch screens, mouse buttons, or other suitable components. In some implementations, the computing device portion 316 may be hingeably attached to the switchable display 300 to enable the electronic device 301 to fold between an open position and a closed position.

The switchable display 300 may include an array 318 of movable pixel units 302. Only a single example movable pixel unit 30 is illustrated in FIG. 3A for clarity. Switchable display 300 may also include a display screen 314 disposed over the array 318 of movable pixel units 302. The array 318 may be a two-dimensional (2D) array 318 and span an entire width and height of the display screen 314 so as to create an entire display of movable pixel units 302. As such, display screen 314 may cover the entirety of the 2D array 318, and the array 318 is therefore represented in dashed lines. The movable pixel units 302 of the 2D array 318 may operate in conjunction with each other, at the instruction of the computing device portion 316, or a processor thereof, to create a visual representation of content, e.g., images, text, video, GUI's, etc., which is then presented through the display screen 314 to a user.

Figure 3B:
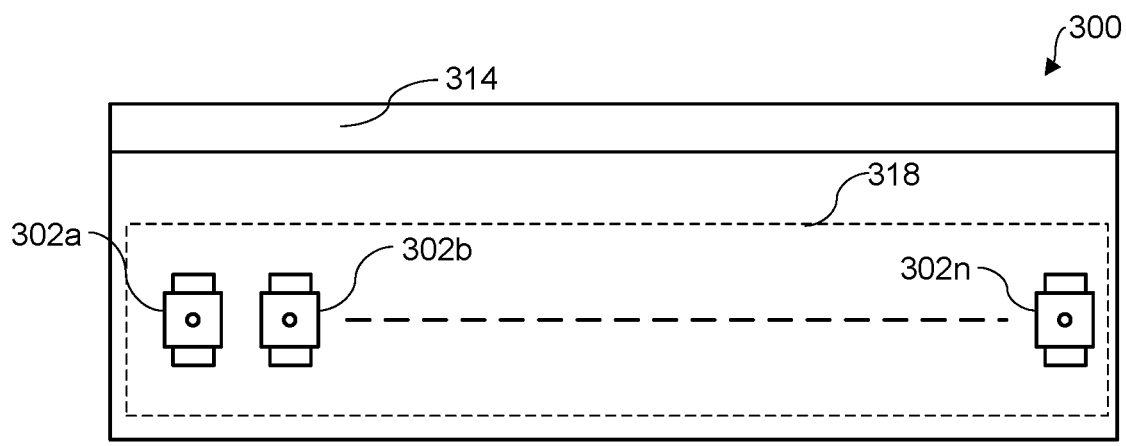
FIG. 3B is schematic cross-sectional view of the example electronic device of FIG. 3A.

Referring now to FIG. 3B, a schematic cross-sectional view of example electronic device 301, and the switchable display 300 thereof, taken along view line 3B-3B of FIG. 3A, is illustrated. The schematic cross-sectional view illustrates a one-dimensional (1D) portion of the 2D array 318, comprising movable pixel units 302a, 302b . . . 302n, referred to collectively as movable pixel units 302. The array 318 may include more movable pixel units 203 than as illustrated, in some implementations. Each movable pixel unit 302 may include a rotatable motive element comprising a microelectromechanical motor to rotate the movable pixel unit 302 between a first position and a second position, as described above. Further, each movable pixel unit 302 may include a first display unit having an emissive display characteristic, and a second display unit having a reflective display characteristic. The microelectromechanical motor of each movable pixel unit may rotate to position the first display unit having the emissive display characteristic to face the display screen 314 in a first position. Similarly, the microelectromechanical motor of each movable pixel unit may also rotate to position the second display unit having the reflective display characteristic to face the display screen 314 in a second position.

The switchable display 300 may be in a first display mode when all of the movable pixel units 302 of the array 318 are facing the display screen 314 in the first position. Such a display mode may be an emissive display mode. Similarly, the switchable display 300 may be in a second display mode when all of the movable pixel units 302 are facing the display screen in the second position. Such a display mode may be a reflective display mode. Stated differently, the electronic device 301, and the switchable display 300 thereof, may be switched between an emissive display mode, wherein the first display unit of each movable pixel unit 302 is facing the display screen 314, and a reflective display mode, wherein the second display unit of each movable pixel unit 302 is facing the display screen 314.

In some implementations, the emissive display mode and the reflective display mode may be user selectable. In the emissive display mode, each of the movable pixel units 302 may work cooperatively to use emissive display technology to provide visual content to the display screen 314 by way of emitting light. In the reflective display mode, each of the movable pixel units 302 may work cooperatively to use reflective display technology to provide visual content to the display screen 314 by way of reflecting environmental or ambient light. Therefore, in some implementations, a user may select the emissive display mode if viewing active, fast-changing video, animations, video games or other content where utilizing a faster refresh rate would be beneficial. Further, a user may select the reflective display mode if viewing text, still images, or using the electronic device outside or in an area with a relatively high brightness or amount of light. The reflective display mode will enable the user to be able to see the display adequately in such bright conditions and will also enable the electronic device to use less power since the display will not be emitting its own light. Additionally, the reflective display mode may be associated with a low-power or power-saving mode, setting, or status of the electronic device 301. As such, the electronic device 301 may prompt or suggest to the user to switch to the reflective display mode if the available power or battery charge falls below a specified threshold. Alternatively, the electronic device 301 may transition into a power-saving mode when the reflective display mode is selected in order to further save or lower power consumption.

In other implementations, the electronic device may be capable of switching between the display modes automatically. Thus, the electronic device 301 may be able to recognize attributes of the content being displayed or viewed, e.g., rate of change of pixel color or activation, refresh rate of the display, etc., and may further be able to sense environmental conditions, e.g., amount of ambient or environmental light or brightness. The electronic device 301 may be able to use such sensor input and display attributes to determine whether the emissive or reflective display mode would be more appropriate or beneficial to employ, and to make the switch accordingly between the two.

What is claimed is:

1. A switchable display, comprising:
 a movable pixel unit, comprising:
  a rotatable motive element;
  a first display unit having a first display characteristic disposed on a first side of the rotatable motive element; and
  a second display unit having a second display characteristic, different from the first display characteristic, and disposed on a second side of the rotatable motive element, different from the first side, and wherein the first display characteristic is an emissive display characteristic, and the second display characteristic is a reflective display characteristic.

2. The switchable display of claim 1, further comprising a display screen.

3. The switchable display of claim 2, wherein the rotatable motive element is to position the first display unit to face the display screen in a first display mode, and to position the second display unit to face the display screen in a second display mode.

4. The switchable display of claim 3, wherein the first and second display units are to be substantially parallel to the display screen when disposed in the first display mode and the second display mode, respectively.

5. The switchable display of claim 3, wherein the rotatable motive element comprises a microelectromechanical motor.

6. A switchable display, comprising:
 a display screen;
 a movable pixel unit, comprising:
  a rotatable motive element;
  a first display unit having a first display characteristic and disposed on a first side of the rotatable motive element; and
  a second display unit having a second display characteristic, different from the first display characteristic, and disposed on a second side of the rotatable motive element, opposite from the first side, and wherein the first display characteristic is an emissive display characteristic, and the second display characteristic is a reflective display characteristic,
 wherein the rotatable motive element is to rotate the movable pixel unit to position the first display unit to face the display screen in a first display mode, and to position the second display unit to face the display screen in a second display mode.

7. The switchable display of claim 6, wherein the rotatable motive element comprises a microelectromechanical motor.

8. The switchable display of claim 6, wherein the switchable display is a part of a standalone monitor.

9. The switchable display of claim 6, wherein the switchable display is a part of an integrated computing device.

10. An electronic device, comprising:
 a computing device portion;
 a switchable display attached to the computing device portion, comprising:
  a display screen; and
  an array of movable pixel units, each movable pixel unit comprising:
   a rotatable motive element comprising a microelectromechanical motor;
   a first display unit disposed on a first side of the rotatable motive element; and
   a second display unit disposed on a second side of the rotatable motive element, different from the first side,
  wherein the first display unit has an emissive display characteristic and the second display unit has a reflective display characteristic.

11. The electronic device of claim 10, wherein the microelectromechanical motor is to rotate the movable pixel unit to position the first display unit to face the display screen in an emissive display mode, and to position the second display unit to face the display screen in a reflective display mode.

12. The electronic device of claim 11, wherein the emissive display mode and the reflective display mode are user-selectable.

13. The electronic device of claim 11, wherein the computing device portion is to be in a power-saving mode when the switchable display is in the reflective display mode.

* * * * *